United States Patent
Sellinger et al.

(10) Patent No.: US 9,246,106 B2
(45) Date of Patent: Jan. 26, 2016

(54) ELECTRON DEFICIENT MOLECULES AND THEIR USE IN ORGANIC ELECTRONIC APPLICATIONS

(75) Inventors: Alan Sellinger, Stanford, CA (US); Xu Han, Pudong (CN); Jason Bloking, Mountain View, CA (US); Michael D. McGehee, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 256 days.

(21) Appl. No.: 13/440,145

(22) Filed: Apr. 5, 2012

(65) Prior Publication Data

US 2012/0255615 A1   Oct. 11, 2012

Related U.S. Application Data

(60) Provisional application No. 61/516,559, filed on Apr. 5, 2011.

(51) Int. Cl.
*H01L 31/0256* (2006.01)
*H01L 51/00* (2006.01)
*H01L 51/42* (2006.01)

(52) U.S. Cl.
CPC ........ *H01L 51/0053* (2013.01); *H01L 51/0056* (2013.01); *H01L 51/0059* (2013.01); *H01L 51/0071* (2013.01); *H01L 51/0094* (2013.01); *H01L 51/4253* (2013.01); *H01L 2031/0344* (2013.01); *Y02E 10/549* (2013.01)

(58) Field of Classification Search
CPC ........ H01L 31/00–31/078; Y02E 10/50–10/60
USPC .................................... 136/243–265
See application file for complete search history.

(56) References Cited

U.S. PATENT DOCUMENTS

| | | | |
|---|---|---|---|
| 7,906,724 B2 | 3/2011 | Sellinger et al. | |
| 2006/0174937 A1* | 8/2006 | Zhou | 136/263 |
| 2008/0223444 A1* | 9/2008 | Marder et al. | 136/263 |
| 2009/0217980 A1 | 9/2009 | Pfeiffer et al. | |
| 2010/0207072 A1 | 8/2010 | Pschirer et al. | |
| 2012/0152357 A1* | 6/2012 | Brown et al. | 136/263 |

OTHER PUBLICATIONS

Woo et al., "Phenyl vs Alkyl Polythiophene: A Solar Cell Comparison Using a Vinazene Derivative as Acceptor," Jan 8, 2010, Chem. Mater. v22n5.

* cited by examiner

*Primary Examiner* — Bach Dinh
(74) *Attorney, Agent, or Firm* — Lumen Patent Firm

(57) ABSTRACT

Improved electron acceptor materials for organic photovoltaic (OPV) cells are provided. More specifically, electron acceptor materials for OPVs can include vinylimide, vinylthioimide, alkynylimide and/or alkynylthioimide moieties. Experimental work with members of this class of material has demonstrated record solar cell power conversion efficiency (3.36%) for non-fullerene acceptors.

11 Claims, 12 Drawing Sheets

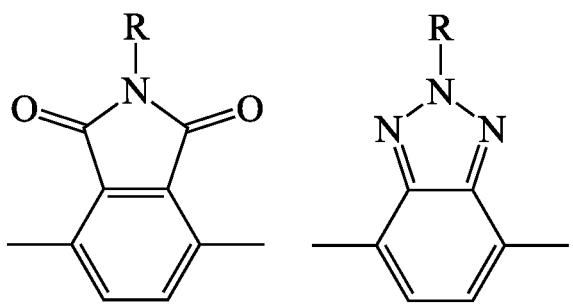
Fig. 3j
Fig. 3n
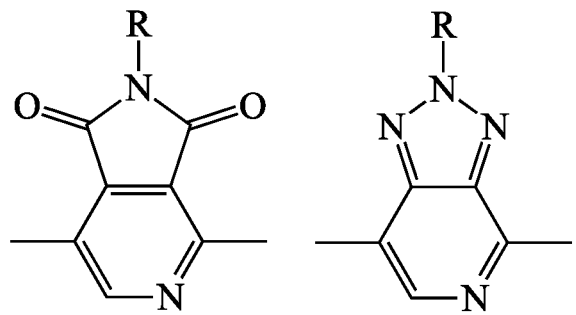
Fig. 3k
Fig. 3o
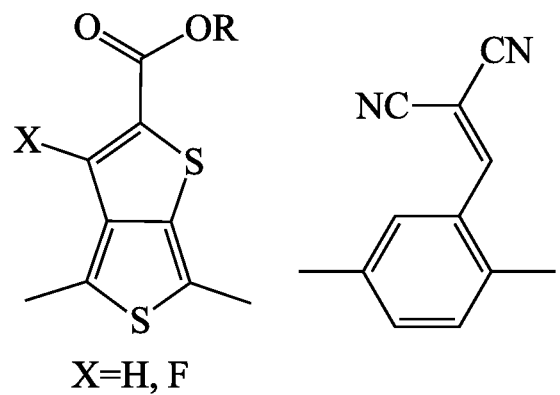
Fig. 3l
X=H, F
Fig. 3p
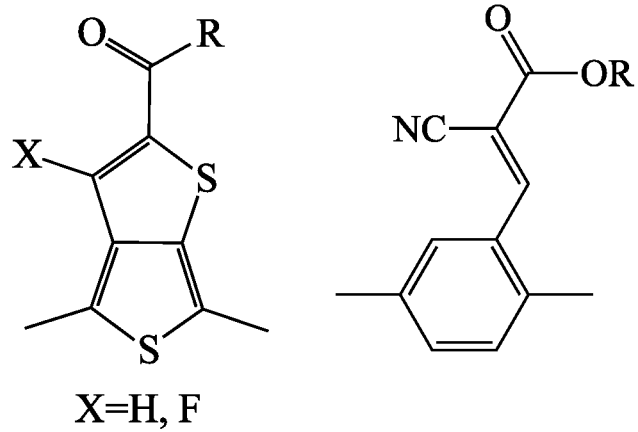
Fig. 3m
X=H, F
Fig. 3q

ELECTRON DEFICIENT MOLECULES AND THEIR USE IN ORGANIC ELECTRONIC APPLICATIONS

CROSS REFERENCE TO RELATED APPLICATIONS

This application claims the benefit of U.S. provisional patent application 61/516,559, filed on Apr. 5, 2011, entitled "Electron deficient molecules and their use in organic electronic applications", and hereby incorporated by reference in its entirety.

FIELD OF THE INVENTION

This invention relates to organic photovoltaic cells.

BACKGROUND

Organic photovoltaics (OPVs) are a promising alternative energy technology that can help address current and future energy issues. By utilizing organic semiconducting small molecules or polymers to directly convert sunlight into electricity, OPVs have several potential advantages over conventional inorganic solar cells, including low-cost fabrication, simple processing, device flexibility, semi-transparency, and aesthetics as they can range in color from blue to red. A solution-processed subset of OPVs, termed bulk heterojunction (BHJ) solar cells, has attracted significant attention during the last decade with recently reported NREL-certified power conversion efficiencies (PCEs) of >8.5%. With regard to materials, fullerenes and their derivatives, such as [6,6]-phenyl $C_{61}$ butyric acid methyl ester ($PC_{61}BM$) and $PC_{71}BM$, have been the dominant electron-acceptor materials in BHJ solar cells due to their large electron affinity, good electron mobility, and development of new synthetic routes towards soluble fullerenes. However, fullerenes have significant disadvantages, such as weak absorption in the visible spectrum compared to typical donor polymers, high-cost production and purification, and an electron affinity that is too large (exothermic) with respect to the ionization potential of a number of donor polymers resulting in low open-circuit voltages ($V_{oc}$). To address these problems, new electron acceptor materials from simple, minimal step, high yield, and inexpensive synthetic processes for application in OPVs are needed. However, very few reports on solution-processed fullerene-free OPVs have shown PCEs approaching or exceeding 2%. Thus, increased efforts to develop novel non-fullerene-based acceptors are still needed.

SUMMARY

FIGS. 1a-b show exemplary OPV device configurations. In the example of FIG. 1a, an electron donor 106 and an electron acceptor 108 are sandwiched between electrodes 102 and 104 to form a two-layer OPV cell. In the example of FIG. 1b, a mixture of the electron donor 106 and the electron acceptor 108 is sandwiched between electrodes 102 and 104 to form a bulk heterojunction (BHJ) OPV cell. Practice of the invention does not depend critically on details of the OPV device geometry, so both two-layer OPVs and BHJ OPVs can make use of the electron acceptor materials described herein.

This work relates to electron acceptor materials for OPVs that include vinylimide, vinylthioimide, alkynylimide and/or alkynylthioimide moieties, where vinyl is a double bond and alkynyl is a triple bond, as parts of molecules making up the OPV electron acceptor material. More specifically, the electron acceptor material can comprise molecules having an electron acceptor B group and one to six electron acceptor A groups covalently bound to the B group (e.g., AB, $A_2B$, $A_3B$, $A_4B$, $A_5B$, and $A_6B$). In cases where two or more A groups are bound to the B group, the A groups can be the same (e.g., A'-B-A', where A' is an instance of an A group) or they can be different (e.g., A'-B-A'', where A' and A'' are distinct instances of an A group).

Each A group individually includes an XYZ structure, where X and Y are connected by two single covalent bonds, and Y and Z are connected by a single covalent bond. Here X is a

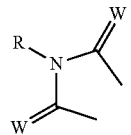

fragment where W are each independently O or S, and where R is a $C_1$-$C_{20}$ branched, unbranched or cyclic alkyl or heteroalkyl group having none, some or all hydrogen atoms substituted with fluorine atoms.

Y is one or more aromatic rings, and Z is a doubly bonded hydrocarbon having a —C═C— (vinyl) structure or a triply bonded —C≡C— (alkynyl) structure. The A-B bonds are via the Z parts of the A groups. Thus the Z parts of the A groups are linking groups.

Exemplary members of this family of structures are shown on FIGS. 2a-l. Thus, the X fragment is an example of the imide or thioimide, and the Z fragment is the vinyl or alkynyl in the summary nomenclature given above (i.e., vinylimide, vinylthioimide, alkynylimide and/or alkynylthioimide). Thus, a vinylimide moiety includes both a vinyl moiety and an imide moiety.

More specifically, a vinylimide is defined herein as any chemical structure that includes both a doubly bonded hydrocarbon having a —C═C— (vinyl) structure as a linking group and a

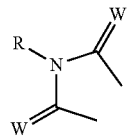

fragment where W is O and R can be any group.

A vinylthioimide is defined herein as any chemical structure that includes both a doubly bonded hydrocarbon having a —C═C— (vinyl) structure as a linking group and a

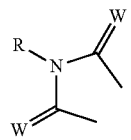

fragment where W is O or S, at least one of the W is an S, and R can be any group.

An alkynylimide is defined herein as any chemical structure that includes both a triply bonded —C≡C— (alkynyl) structure as a linking group and a

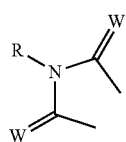

fragment where W is O and R can be any group.

An alkynylthioimide is defined herein as any chemical structure that includes both a triply bonded —C≡C— (alkynyl) structure as a linking group and a

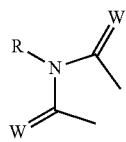

fragment where W is O or S, at least one of the W is an S, and R can be any group.

Practice of the invention does not depend critically on the choice of the electron acceptor for the B group. Any material or chemical structure that is an electron acceptor (relative to the electron donor of an OPV cell) can be used as the B group. Preferably, the B group is a conjugated group, so that the resulting $A_nB$ molecules are semiconducting. Examples of suitable B groups are given on FIGS. 3a-t.

In the experiments described below, A-B-A structures are considered where A is a vinylimide moiety (e.g., the structures shown on FIGS. 2a and 2b) and B is a benzothiadiazole moiety (e.g., the structures shown on FIG. 3a).

Preferably, the molecules of the electron acceptor material are planar (as opposed to twisted by steric interactions), in order to facilitate crystallization of the electron acceptor. Such crystallization is expected to desirably improve electron transport and electron mobility.

DETAILED DESCRIPTION

In this section, we describe experiments relating to compounds as described above. More specifically, we consider two examples of the above described class of materials (PI-BT and NI-BT), and compare their performance to each other and to a reference material that is not an example of the above described class of materials (EV-BT). It will be convenient to briefly review the EV-BT story in the following paragraph.

Here P3HT is short for poly(3-hexylthiophene), which is a semicrystalline polymeric electron donor used in some of the experiments.

Figure 1A:
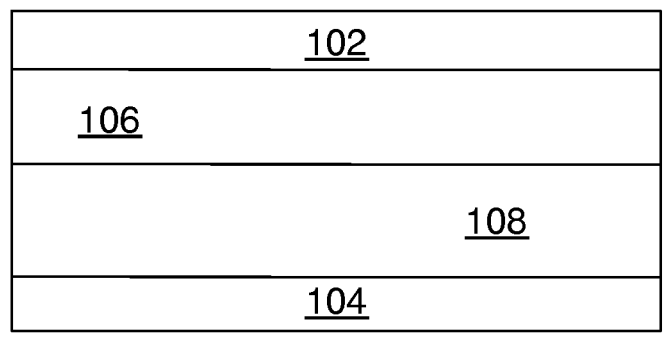
FIGS. 1a-b show exemplary configurations for an organic photovoltaic cell.
Figure 1B:
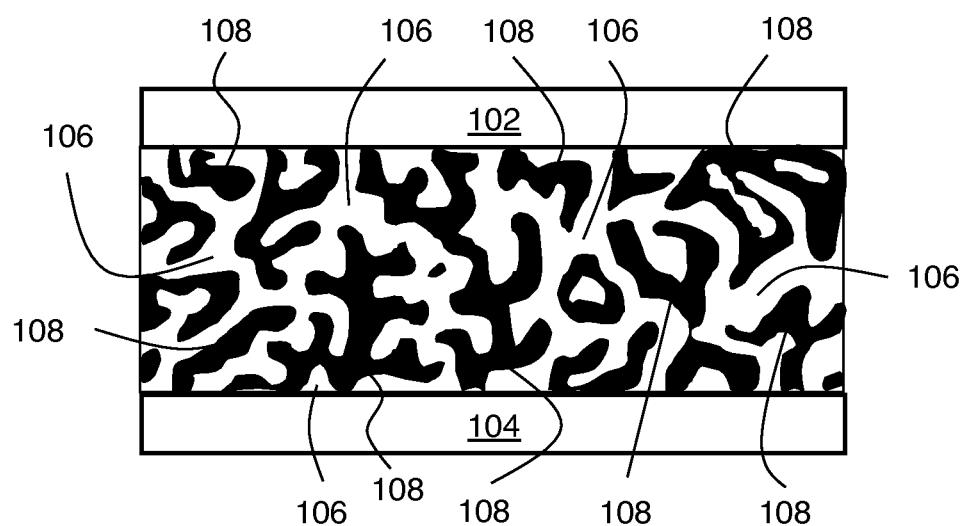
Figure 2A:
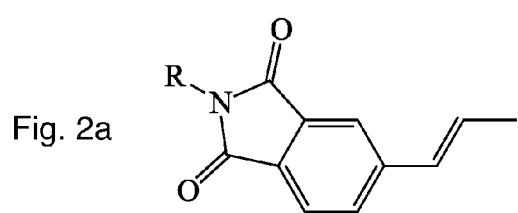
FIGS. 2a-l show exemplary configurations for the A groups considered herein.
Figure 2E:
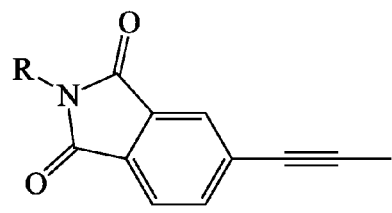
Figure 2B:
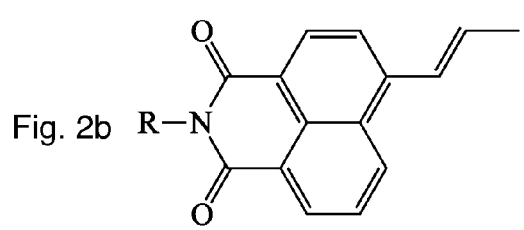
Figure 2F:
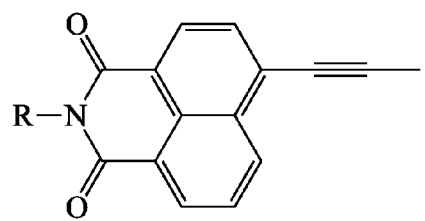
Figure 2C:
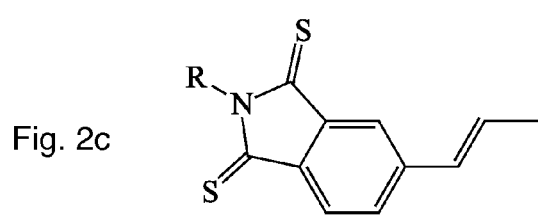
Figure 2G:
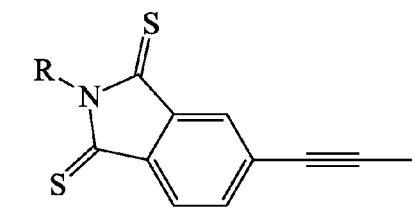
Figure 2D:
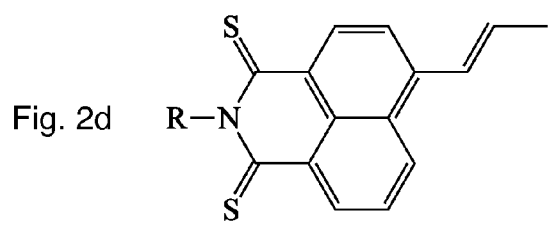
Figure 2H:
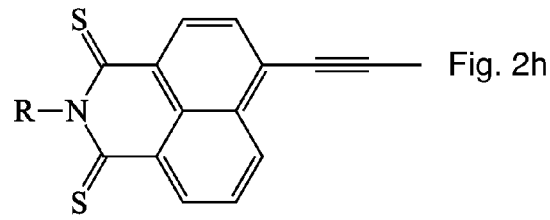
Figure 2I:
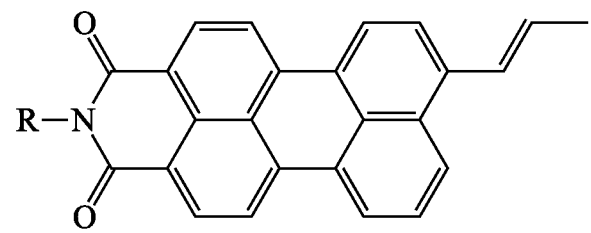
Figure 2J:
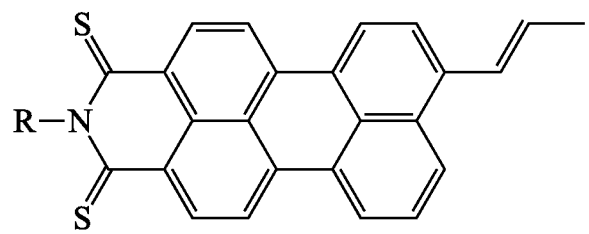
Figure 2K:
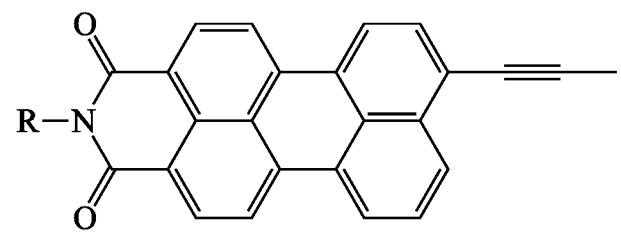
Figure 2L:
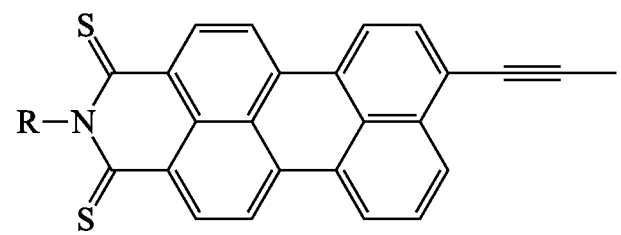
Figure 3A:
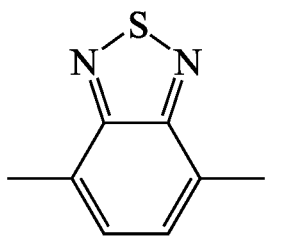
FIGS. 3a-t show exemplary configurations for the B groups considered herein.
Figure 3B:
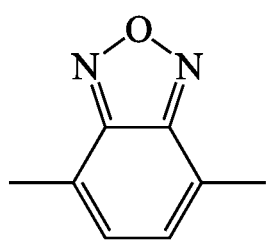
Figure 3C:
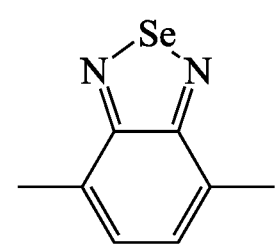
Figure 3D:
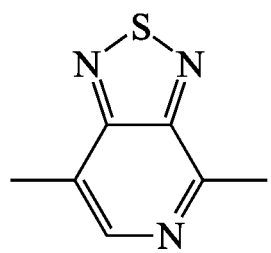
Figure 3E:
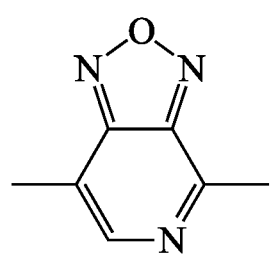
Figure 3F:
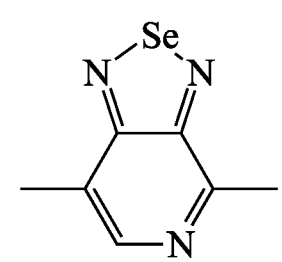
Figure 3G:
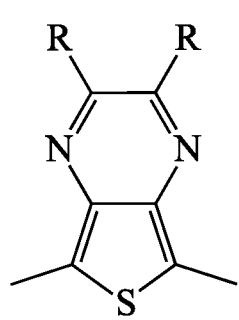
Figure 3H:
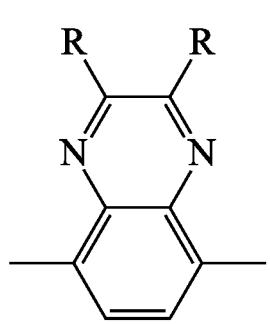
Figure 3I:
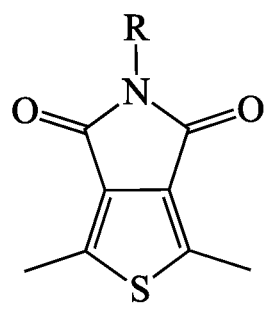
Figure 3R:
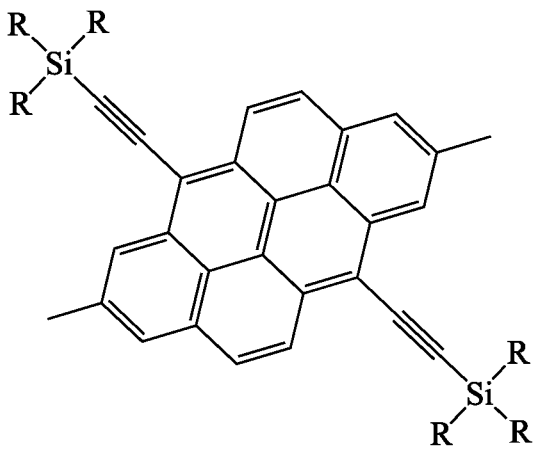
Figure 3S:
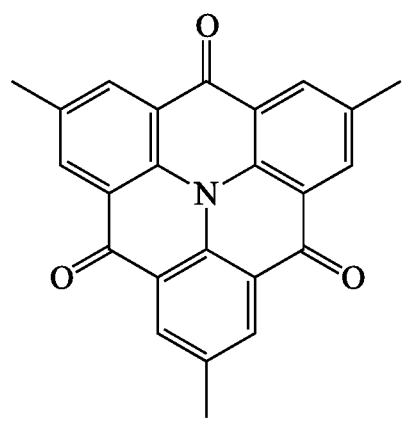
Figure 3T:
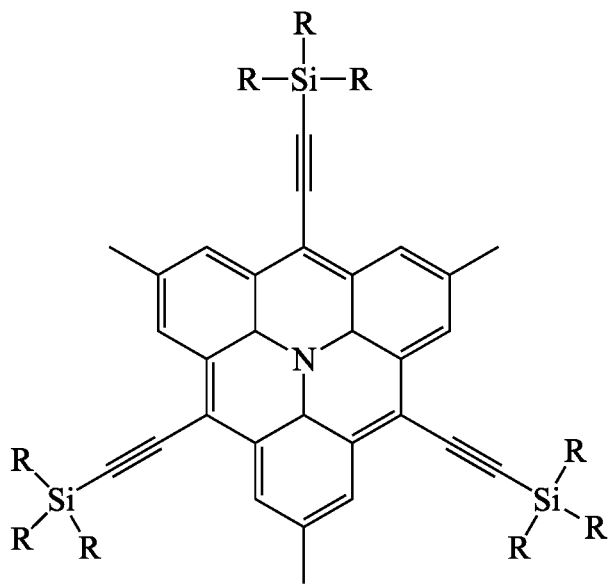
Figure 4A:
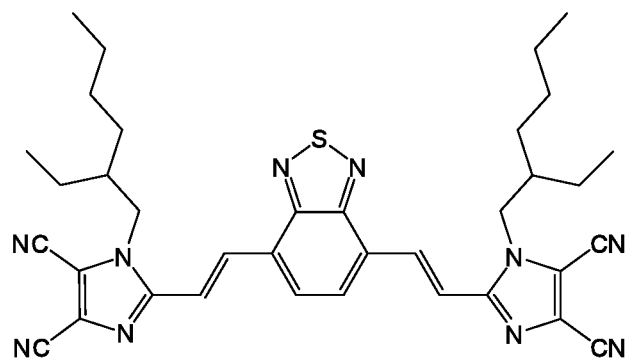
FIGS. 4a-d show structures pertaining to experimental work relating to principles of the invention.

In previous work, the synthesis and characterization of a series of n-type conjugated materials based on the Heck reaction of 4,5-dicyano-2-vinylimidazole (Vinazene™) with selected dibromoaromatics is described. These materials were easily prepared in high yields from one-step reactions using commercially available materials. The most promising material from these studies was 4,7-bis(2-(1-(2-ethylhexyl)-4,5-dicyanoimidazol-2-yl)vinyl)benzo[c][1,2,5]-thiadiazole (EV-BT), shown in FIG. 4a. EV-BT, with its favorable (estimated) solid-state electron affinity (3.65 eV) and strong absorption in the visible spectrum produced, with selected donor polymers, OPVs with $V_{oc}$ up to 1.4 V and PCEs of 1.4%. We suspect the lower fill factor (FF) and short-circuit current ($J_{SC}$) of these devices (50% and 5.7 mA cm$^{-2}$) compared to P3HT:PC$_{61}$BM (67% and ~10 mA cm$^{-2}$) can be partially attributed to the low electron mobility of EV-BT [$10^{-5}$ cm$^2$ V$^{-1}$s$^{-1}$, as measured by space charge limited current (SCLC) methods] compared to PC$_{61}$BM ($10^{-3}$ cm$^2$ V$^{-1}$s$^{-1}$). A reason for the low electron mobility of this acceptor may be the asymmetric alkyl-chain direction on the vinyldicyanoimidazole moiety that prevents efficient π-π molecular stacking, as shown in FIG. 4a.

A) Introduction

Figure 4B:
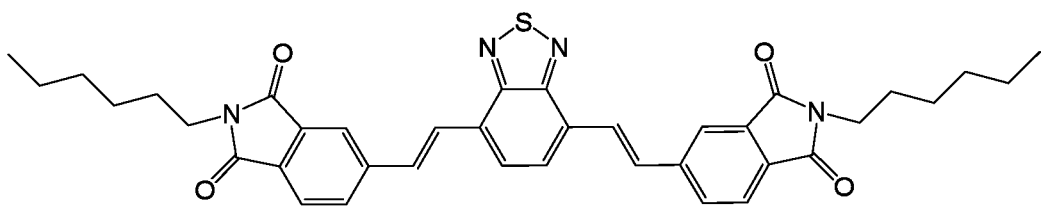
Figure 4C:
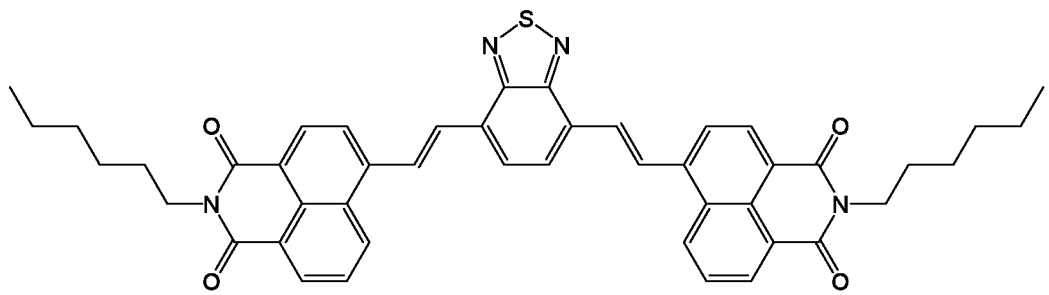
Figure 4D:
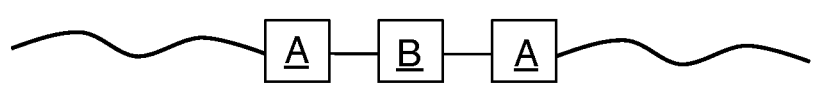

To increase the electron mobility in the acceptor we considered the introduction of electron deficient vinyl imide units as "A" building blocks in an A-B-A structure (FIG. 4d) that allows for more symmetric placement of the alkyl chains at the ends of the molecule, as shown in FIGS. 4b (PI-BT) and 4c (NI-BT). Furthermore, the molecules were designed with extended n-conjugation that helps contribute to significant absorption of visible light, and tunable chemistry to allow for modulation of the ionization potential, electron affinity, and solubility.

B) Experimental Methods

B1) Synthesis.

B1a) Synthesis of EV-BT: 4,7-bis(2-(1-(2-ethylhexyl)-4,5-dicyanoimidazol-2-yl)vinyl)benzo[c][1,2,5]-thiadiazole (EV-BT) was synthesized according to procedures reported in the literature. The alkylated Vinazene was synthesized using a modified procedure reported by Johnson and Rasmussen. The final compound, EV-BT was synthesized according to the procedure reported by Ooi et al.

B1b) Synthesis of Br-Ph-Im: The imide side group, N-hexyl-4-bromo-phthalimide (Br-Ph-Im), was first synthesized according to a procedure adapted from Dierschke et al. A solution of 2.00 g 4-bromophthalic anhydride, 12.0 mL propionic acid, and 1-hexylamine (1.5 eq.) was stirred under N$_2$ at 130° C. for three days. The cooled solution was diluted with water, and extracted with dichloromethane three times. The organic layer was dried over magnesium sulfate and concentrated. The compound was purified by column chromatography in silica gel with 50% ethyl acetate in hexane. After precipitation in 50% methanol in water the crystals were collected by vacuum filtration and dried overnight. The product was a white solid weighing 2.63 g (96% yield). $^1$H NMR (300 MHz, CDCl$_3$): δ 0.87 (t, 3H), 1.31 (m, 6H), 1.65 (qui, 2H), 3.66 (t, 2H), 7.71 (d, 1H), 7.83 (d, 1H), 7.97 (s, 1H). $^{13}$C NMR (100 MHz, CDCl$_3$): δ 14.00, 22.48, 26.47, 28.45, 31.30, 38.29, 124.51, 126.53, 128.71, 130.64, 133.78, 136.80, 167.05, 167.59. C$_{14}$H$_{16}$BrNO$_2$ (310.19): Calcd. C 54.21, H 5.20, N 4.52, Br 25.76; Found C 54.07, H 4.97, N 4.46, Br 26.28.

B1c) Synthesis of Br—N-Im: The imide side group, N-hexyl-4-bromo-naphthalimide (Br—N-Im), was synthesized using the same general method as described above for PI-BT, except using 4-bromo-1,8-naphthalic anhydride. The product was a tan solid weighing 1.91 g (74% yield). $^1$H NMR (300 MHz, CDCl$_3$): δ 0.89 (t, 3H), 1.34 (m, 6H), 1.72 (qui, 2H), 4.16 (t, 2H), 7.85 (t, 1H), 8.05 (d, 1H), 8.40 (d, 1H), 8.56 (d, 1H), 8.64 (d, 1H). $^{13}$C NMR (100 MHz, CDCl$_3$): δ 14.04, 22.53, 26.74, 27.98, 31.50, 40.58, 122.20, 123.06, 128.00, 128.87, 130.10, 130.50, 131.00, 131.11, 131.92, 133.10, 163.49, 163.51. C$_{18}$H$_{18}$Br$_2$NO$_2$ (360.25): Calcd. C 60.01, H 5.04, N 3.89, Br 22.18; Found C 59.93, H 4.83, N 3.87, Br 26.26.

B1d) Synthesis of BT-Si: The central group, 4,7-triethoxyvinylsilane-benzo[c]-1,2,5-thiadiazole (BT-Si), was synthesized by adding toluene (25 mL), triethoxyvinylsilane (1.8 mL, 8.50 mmol), and nitrogen degassed Cy$_2$NMe (1.8 mL, 8.50 mmol) to a Schlenk flask containing 4,7-dibromobenzo[c]-1,2,5-thiadiazole (1.00 g, 3.40 mmol) and Pd(P[tBu]$_3$)$_2$ (75 mg, 0.15 mmol) under nitrogen. The solution was stirred at 90° C. for 48 hours and then extracted three times with 5% HCl at 5° C. and once with brine. After drying over magnesium sulfate, the solvent was removed through rotoevaporation. The crude product was a very sticky red gel weighing 1.35 g and was used without further purification for the next reaction step. $^1$H NMR (300 MHz, CDCl$_3$): δ 1.30 (t, 18H), 3.92 (qui, 12H), 7.05 (d, 2H), 7.68 (s, 2H), 7.74 (d, 2H).

B1e) Synthesis of PI-BT: 4,7-bis(4-(N-hexyl-phthalimide)vinyl)benzo[c]1,2,5-thiadiazole (PI-BT), was prepared by adding BT-Si (0.80 g, 1.56 mmol), Br-Ph-Im (1.06 g, 3.43 mmol), Pd(dba)$_2$ (90 mg, 0.16 mmol), and ligand (P(o-tol)$_3$, 142 mg, 0.47 mmol) to a Schlenk flask. The flask was evacuated, and then refilled with N$_2$ three times. 25 mL toluene was added and the reaction mixture was stirred at 80° C. for 20 min. Tetrabutyl ammonium fluoride (3.7 mL, 1.0 M in THF, 3.7 mmol) was then added and the reaction mixture was stirred at 80° C. for 2 days. The solution was extracted with water and CH$_2$Cl$_2$ three times and dried over magnesium sulfate. The compound was purified by column chromatography in silica gel using CH$_2$Cl$_2$. Precipitation was done in methanol and the red color solid weighing 0.49 g (49% yield) was collected by vacuum filtration and dried overnight. $^1$H NMR (300 MHz, CDCl$_3$): δ 0.89 (t, 6H), 1.33 (m, 12H), 1.71 (qui, 4H), 3.70 (t, 4H), 7.75 (d, 2H), 7.79 (s, 2H), 7.86 (d, 2H), 7.89 (d, 2H), 8.14 (s, 2H), 8.24 (d, 2H). $^{13}$C NMR (100 MHz, CDCl$_3$): δ 14.02, 22.52, 26.55, 28.58, 31.37, 38.18, 120.51, 123.66, 128.20, 128.53, 129.26, 130.85, 132.07, 133.03, 143.46, 153.65, 168.13, 168.31.

B1f) Synthesis of NI-BT: 4,7-bis(4-(N-hexyl-naphthalimide)vinyl)benzo[c]1,2,5-thiadiazole (NI-BT), was prepared according to the same method as PI-BT but using Br—N-Im (1.24 g, 3.43 mmol). The product was a red color solid weighing 0.25 g (21%). $^1$H NMR (300 MHz, CDCl$_3$): δ 0.90 (t, 6H), 1.35 (m, 12H), 1.75 (qui, 4H), 4.19 (t, 4H), 7.73 (d, 2H), 7.80 (d, 2H), 7.86 (d, 2H), 8.16 (d, 2H), 8.63 (d, 2H), 8.66 (d, 2H), 8.72(d, 2H), 9.12 (d, 2H). $^{13}$C NMR (100 MHz, CDCl$_3$): δ 14.08, 22.58, 26.82, 28.07, 31.56, 40.54, 121.99, 123.15, 123.68, 126.97, 128.72, 129.61, 129.63, 129.69, 129.76, 130.71, 130.97, 131.28, 134.89, 141.20, 153.75, 163.97, 164.19.

B2) Materials Characterization.

$^1$H and $^{13}$C NMR spectra were recorded using a Varian Inova 300 or 400 in CDCl$_3$ at 293 K. Thermal gravimetric analyses (TGA) were carried out using a Mettler TOLEDO TGA/SDTA 851e at a heating rate of 10° C. min$^{-1}$ under nitrogen flow of 20 mL min$^{-1}$. Differential scanning calorimetry (DSC) analyses were performed on a DSC Q100 (TA Instruments). DSC curves were recorded at a scanning rate of 10° C. min$^{-1}$ under nitrogen flow. UV-Vis absorption spectra in tetrahydrofuran (THF) solution were recorded in a UV-Vis spectrophotometer (Cary 6000i) at room temperature using a glass cuvette with a path length of 1 cm. Photoluminescence (PL) spectra were recorded on a Horiba Jobin Yvon FL3-2IHR fluorometer. Photo-electron spectra in air (PESA) were recorded in air on a Riken Keiki AC-2 ultraviolet photoelectron spectrophotometer. Cyclic voltammetry (CV) measurements were carried out on a CHI411 electrochemical workstation, using a concentration of a few millimolar in dichloromethane containing approximately 0.05 M supporting electrolyte of tetrabutylammonium phosphorous hexafluoride in a three-electrode cell, where the saturated calomel electrode (SCE) was used as the reference electrode and platinum wire as the working electrode. The scanning rate was 0.1 V s$^{-1}$.

B3) Device Preparation and Characterization.

Solutions of P3HT (Rieke Metals, EE-grade) and powder of either PI-BT or NI-BT were prepared in two methods. First, weighed amounts of each material in a 1:1 ratio (by weight) were added into an amber glass vial to which solvent was added to yield the desired concentration. Solvents used consisted of chloroform, chlorobenzene and 1,2-dichlorobenzene (Aldrich). Solutions were then diluted as needed to test the effects of solution concentration on device performance. The second solution preparation method consisted of making separate stock solutions of P3HT and acceptor material in chlorobenzene at concentrations of 20 mg mL$^{-1}$. These stock solutions were blended together in various ratios in order to test the effect of donor:acceptor blend ratio on device performance. All solutions were prepared in a dry nitrogen glove box to avoid exposure of all materials to oxygen and moisture and were stirred overnight at temperatures of at least 90° C. to ensure complete dissolution.

Bulk heterojunction solar cells were prepared on glass substrates with tin-doped indium oxide (ITO, 15 Ωsq$^{-1}$) patterned on the surface. Substrates were first scrubbed with dilute Extran 300 detergent solution to remove organic residues before immersing in an ultrasonic bath of dilute Extran 300 for 15 minutes. Samples were rinsed in flowing deionized water for 5 minutes before being sonicated for 15 minutes each in successive baths of acetone and isopropanol. After a final 5 minute rinse in flowing deionized water, samples were dried with pressurized nitrogen before being exposed to a UV-ozone plasma for 15 minutes. Immediately after UV-ozone treatment, an aqueous solution of poly(3,4-ethylenedioxythiophene) poly(styrenesulfonate) (PEDOT:PSS, CLEVIOS™ P VP AI 4083) was deposited via spin coating at a speed of 4000 rpm for 30 s, resulting in a film approximately 25 nm in thickness. The samples were then dried on a hot plate at 150° C. for 15 minutes to remove residual water. All steps above were performed in a laminar flow hood to prevent adsorption of dust particles on the substrates.

Samples were then transferred into a dry nitrogen glove box (<1 ppm O$_2$) for active layer deposition. Blended solutions of P3HT and acceptor molecules were deposited by spin-coating (1500 rpm for 45 s unless otherwise noted) using a Laurell Technologies WS-650-NPP-LITE programmable spin coater. After spinning, samples were placed in a covered petri dish overnight to dry completely. After drying, the edges of samples were scraped with a razor blade to remove a part of the active layer in order to make contact to the underlying ITO layer and then placed in a thermal evaporator for evaporation of electrodes. Two cathode material stacks were used: LiF (1 nm)/Al (200 nm) for P3HT:PI-BT bulk heterojunction cells and Ca (7 nm)/Al (200 nm) for P3HT:NI-BT cells. LiF (CERAC Technologies) was evaporated at a rate no higher than 0.1 Å s$^{-1}$ to ensure accurate film thickness. Calcium was evaporated at a rate of 1 Å s$^{-1}$ and aluminum evaporated at 10 Å s$^{-1}$. Following cathode deposition, samples underwent I-V testing inside the glove box prior to and at several stages during a thermal annealing step to determine optimal annealing time and temperature. High-efficiency devices were then selected for external quantum efficiency (EQE) testing. EQE testing was performed inside the glove box using monochromatic light from a tungsten lamp and the photocurrent spectrum was calibrated to a NIST traceable silicon calibration photodiode.

Two-dimensional grazing incidence x-ray scattering (GIXS) spectra were conducted on both blended and pure films (P3HT and acceptor) prepared identically to solar cells but on silicon substrates and without the PEDOT:PSS and metal electrode layers. GIXS experiments were conducted on beamline 11-3 at the Stanford Synchrotron Radiation Laboratory (SSRL).

B4) Computational Methodology.

Calculations for the (gas-phase) molecular series in the neutral, radical-cation, and radical-anion states were carried out with density functional theory (DFT) using the Becke's three-parameter exchange functional, and the Lee-Yang-Parr correlation functional (B3LYP) in conjunction with a 6-31G (d,p) Pople basis set. Low-lying excited state properties were evaluated at the neutral ground state geometries using time dependent DFT (TDDFT) at the B3LYP/6-31G(d,p) level. All calculations were performed using the Gaussian (03 Revision E.01) suite of programs.

C) Results And Discussion

Initial quantum-chemical calculations using density functional theory (DFT) of methyl analogs show that PI-BT, like EV-BT, maintains a planar geometry in the ground state that, together with the position of the alkyl chains, we propose will favor efficient π-π stacking of the acceptor molecules and enhance the electron mobility in the π-π direction. However, in the case of NI-BT, steric interactions between neighboring hydrogen atoms in the naphthyl and vinyl moieties induce a 27.3° twist in the ground state of the isolated molecule. This twist may prohibit efficient packing and crystal formation between neighboring molecules, and thus lower the electron mobility in NI-BT compared with PI-BT.

Figure 5:
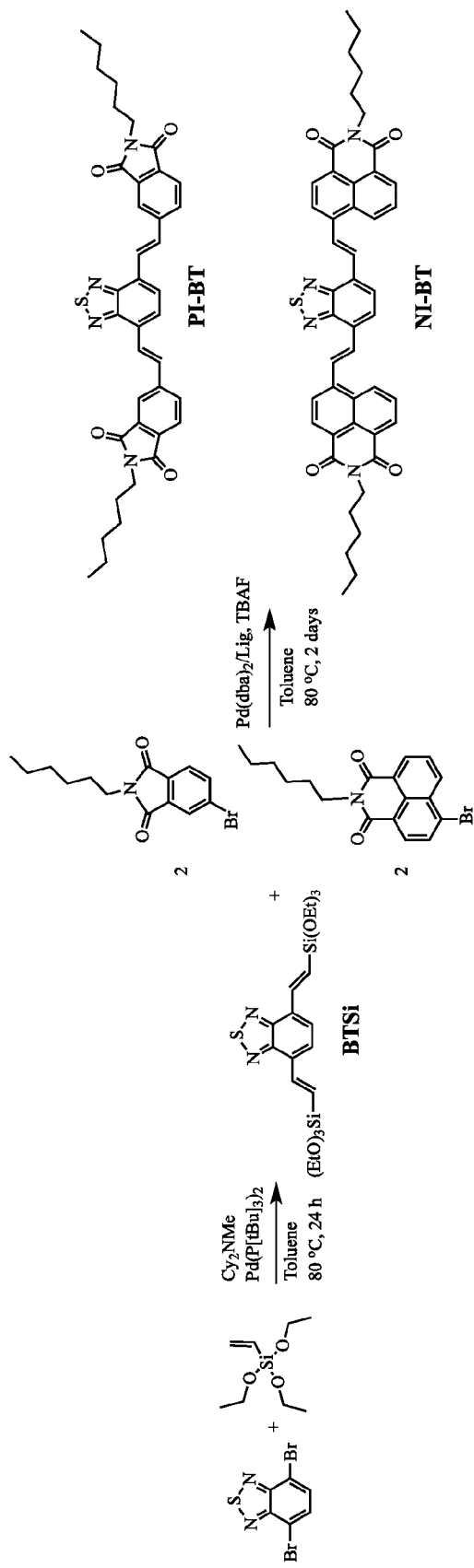
FIG. 5 shows a synthesis scheme for PI-BT and NI-BT.

Based on the quantum-chemical studies, we designed PI-BT and NI-BT as electron-accepting molecules for application in BHJ solar cells. The molecules were synthesized through the sequential modified Heck coupling reactions shown in Scheme 1 (shown on FIG. 5). The isolated, silicon-based intermediate (BT-Si) was selected as a safer and more environmentally friendly analogue to the organotin counterparts using Stille chemistry. Bis(tri-tert-butylphosphine)palladium(0) (Pd[P(tBu)$_3$]$_2$) was used as a catalyst for the first Heck reaction step of 4,7-dibromobenzothiadiazole with vinyltriethoxysilane to form BT-Si as a red-colored gel in 77% yield. In step two, tetrabutylammonium fluoride (TBAF) was used to remove the triethoxysilyl group and generate 4,7-divinylbenzo[c][1,2,5]thiadiazole in-situ. Bis(dibenzylideneacetone)palladium(0) (Pd(dba)$_2$)/(P(o-tol)$_3$) was then used for the Heck coupling of the in-situ formed 4,7-divinylbenzo[c][1,2,5]thiadiazole with N-hexyl-4-bromo-phthalimide (Br-Ph-Im) and N-hexyl-4-bromo-naphthalimide (Br—N-Im) to form PI-BT and NI-BT respectively in yields of 49 and 21%, Scheme 1.

We confirmed the chemical structures with $^1$H and $^{13}$C NMR. PI-BT shows two $^1$H NMR resonance peaks at 3.70 (4H) and 7.6-8.2 (12H), which are assigned to the methylene protons adjacent to the N of the phthalimide units and the aromatic protons, respectively. The composition of PI-BT was determined in part from the ratio (1:3) of the integrals of these two sets of peaks. Similarly, NI-BT produced two $^1$H NMR resonance sets of peaks at 4.19 (4H) and 7.7-9.4 (16H), which are assigned to the methylene protons adjacent to the N of the naphthalimide units and the aromatic protons, respectively. The composition of NI-BT was also determined in part from the ratio (1:4) of the integrals of these two sets of peaks. $^{13}$C NMR of PI-BT shows six resonance peaks, ranging from 14.02 to 38.18 ppm, that correspond to the hexyl side chains on the phthalimide units. The remaining thirteen peaks, ranging from 120.51 to 168.31 ppm, correspond to the aromatic carbons of the benzothiadiazole, vinyl, and phthalimide units. The $^{13}$C NMR of NI-BT also gave six resonance peaks, ranging from 14.08 to 40.54 ppm, that correspond to the hexyl side chains on the naphthalimide units. The remaining seventeen peaks, ranging from 121.99 to 164.19 ppm, correspond to the aromatic carbons of the benzothiadiazole, vinyl, and naphthalimide units.

The optical, electrical, and thermal properties of EV-BT (provided here as a comparison), PI-BT, and NI-BT were characterized using ultraviolet-visible (UV-Vis) spectroscopy, photoluminescence (PL) spectroscopy, photo-electron spectroscopy in air (PESA), cyclic voltammetry (CV), thermal gravimetric analysis (TGA), and differential scanning calorimetry (DSC) and are reported in Table 1.

TABLE 1

Optical, Electrical and Thermal properties of the Electron Acceptor Molecules.

| acceptor | $\lambda_{abs}$ in THF (nm) | Extinct. coeff. (M$^{-1}$cm$^{-1}$) | Eg (eV)$^a$ | $\lambda_{PL}$ in THF (nm) | IP/EA (eV) | Tm (° C.) |
|---|---|---|---|---|---|---|
| EV-BT | 335, 442 | 3.33 × 10$^5$ | 2.43 | 516 | −6.0/−3.4$^b$<br>−6.1/−3.5$^c$ | 205 |
| PI-BT | 448 | 2.29 × 10$^5$ | 2.34 | 525 | −5.8/−3.3$^b$<br>−6.1/−3.7$^c$ | 156 |
| NI-BT | 467 | 3.85 × 10$^5$ | 2.16 | 547 | −5.7/−3.4$^b$<br>−6.0/−3.8$^c$ | 241 |

$^a$Determined from UV-vis absorption onset in thin film.
$^b$Determined from cyclic voltammetry measurement.
$^c$Determined from photoelectron spectroscopy in air (PESA) measurement and optical bandgap.

Figure 6A:
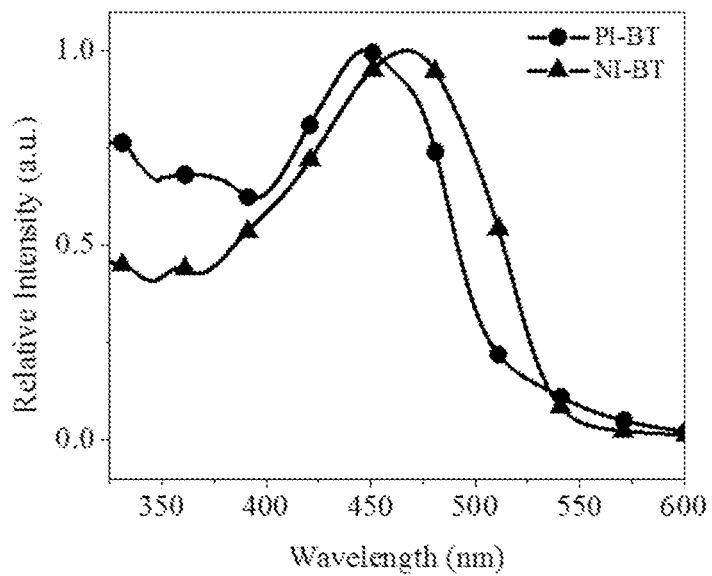
FIGS. 6a-c show characterization results for EV-BT, PI-BT and NI-BT.
Figure 6B:
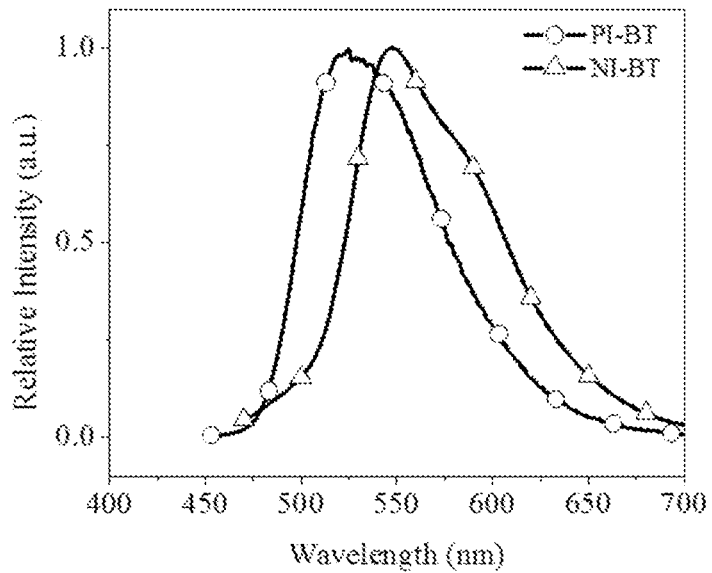
Figure 6C:
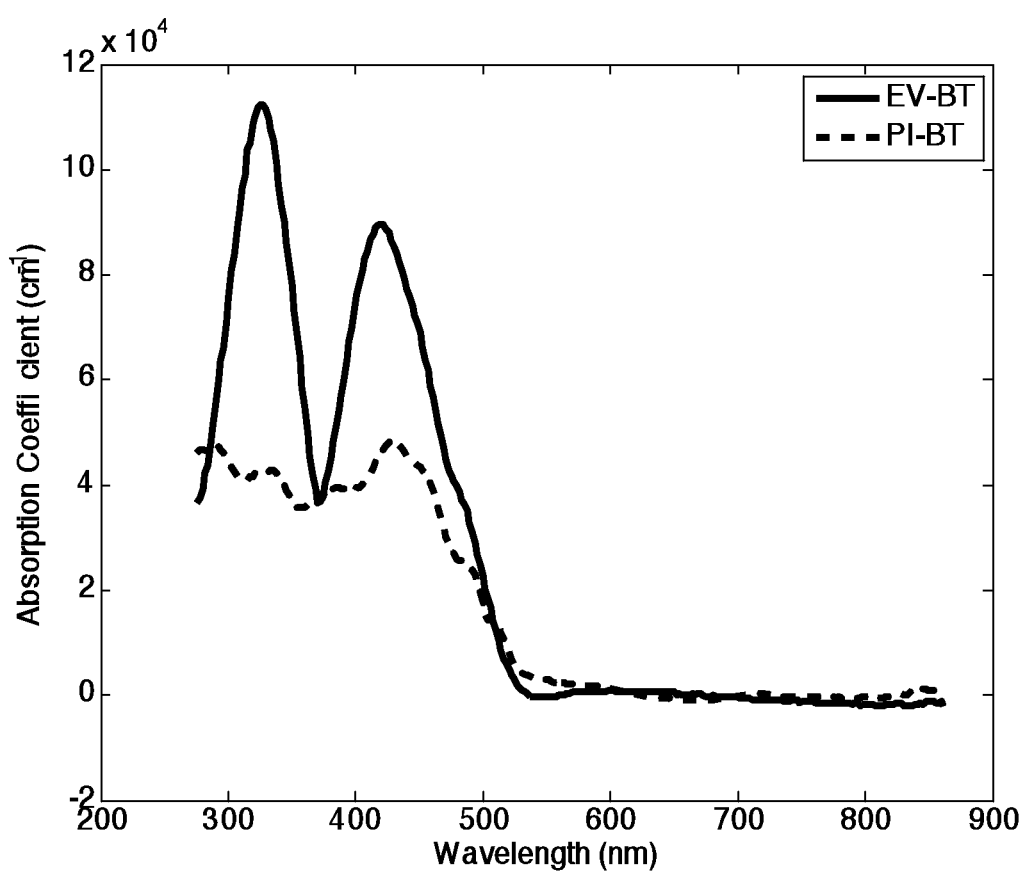

The UV-Vis absorption (FIG. 6a) and PL spectra (FIG. 6b) of PI-BT and NI-BT in dilute THF solutions are shown in FIGS. 6a-b. Thin-film absorption data of EV-BT and PI-BT are also shown in FIG. 6c. EV-BT has two main absorption peaks at 335 and 442 nm. The lower wavelength main absorption peak originates from the Vinazene unit. The absorption onset for EV-BT of 510 nm corresponds to an estimated optical gap of 2.43 eV. The maximum absorption wavelengths ($\lambda_{max, abs}$) of PI-BT and NI-BT, which contain the same "B" building block (benzothiadiazole), but different imide-based "A" building blocks, are 448 and 467 nm, respectively. The absorption onset of NI-BT (575 nm, 2.16 eV) is red-shifted by 45 nm (0.18 eV) compared to PI-BT (530 nm, 2.34 eV) due to the extended conjugation of the naphthalimide unit. Results obtained using time-dependent DFT (TD-DFT) at the B3LYP/6-31G** level are consistent with the empirical results. The first optical transitions are principally HOMO→LUMO electronic excitations. Thus, the optical gap of the acceptor can be tuned using different "A" building blocks to complement the absorption of the donor material. The maximum emission wavelengths ($\lambda_{max,em}$) of EV-BT, PI-BT and NI-BT in solution are at 516, 525 and 547 nm, respectively. The absorption coefficients for EV-BT and PI-BT in solution were measured in the range of 2.3-3.9×10$^5$ $M^{-1}$ cm$^{-1}$, and for thin films the absorption coefficients were 0.4-1.2×10$^5$ cm$^{-1}$, indicating that the molecules have strong light absorption in the visible region of the spectrum, which is desired for contribution to the photocurrent generation in photovoltaic devices. For comparison, the peak absorption coefficients in the visible (350-600 nm) for PC$_{71}$BM and P3HT[46] thin films are 0.6×10$^5$ cm$^{-1}$ and 2.5×10$^5$ cm$^{-1}$.

The ionization energies of EV-BT, PI-BT and NI-BT in solution as estimated by cyclic voltammetry are 5.97, 5.77 and 5.66 eV, respectively. Using photoelectron spectroscopy in air (PESA), the solid-state ionization energies for EV-BT, PI-BT and NI-BT were 6.10, 6.05 and 5.99 eV, respectively. For EV-BT thin films, however, the value of 6.10 eV is a lower limit as the instrument is not able to detect a clear photoelectron signal at excitations above 6.1 eV. The differences in ionization potential measurements between the two techniques have been attributed to solvation effects in the cyclic voltammetry setup. However, a linear relationship between the two measurements has been found experimentally, and this is in qualitative agreement with our data. In addition, DFT calculations on the isolated molecules point to the ionization potential for EV-BT as being considerably larger than that for the other two compounds. The intramolecular reorganization energies for hole transport are of the order of 250-300 meV. The electron affinities of EV-BT (3.43 eV), PI-BT (3.30 eV) and NI-BT (3.35 eV) were also estimated using cyclic voltammetry, and are consistent with electron affinities determined with DFT that indicate EV-BT (2.56 eV) is the easiest to reduce, followed by NI-BT (2.24 eV) and PI-BT (2.03 eV). As with oxidation, the intramolecular reorganization energies for electron-transport are similar for EV-BT and PI-BT, and about 70 meV larger for NI-BT—a consequence of the more twisted geometric structure.

PI-BT and NI-BT do not thermally decompose under nitrogen until 360-370° C. in the TGA measurements, indicating these acceptors have good thermal stability under $N_2$. The melting points were measured using DSC to be in the range of 156-241° C. The relatively high melting points of PI-BT and NI-BT indicate the upper temperature limits of thermal annealing during processing.

BHJ solar cells using P3HT as the donor and EV-BT, PI-BT, or NI-BT as the acceptor were fabricated and characterized in a preliminary device study. P3HT:EV-BT devices were prepared according to a previously published procedure. P3HT:PI-BT BHJ devices were prepared from solutions of P3HT (Rieke, EE-Grade) and PI-BT in various blending ratios and of various concentrations in chloroform, chlorobenzene, and 1,2-dichlorobenzene (Aldrich). Optimal P3HT:PI-BT devices were obtained when using chlorobenzene-based solutions at a total solute concentration of about 20 mg/mL and a blending ratio of 1:1.4 by weight P3HT:PI-BT. Device stacks included ITO/PEDOT:PSS (25 nm)/P3HT:PI-BT (ca. 80 nm)/LiF (1 nm)/Al (200 nm).

Figure 7A:
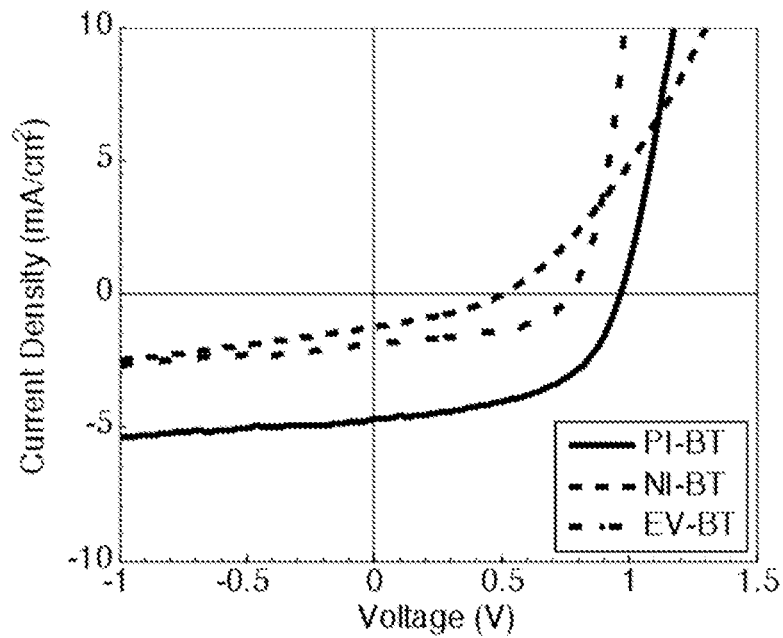
FIGS. 7a-b show solar cell results relating to EV-BT, PI-BT and NI-BT.
Figure 7B:
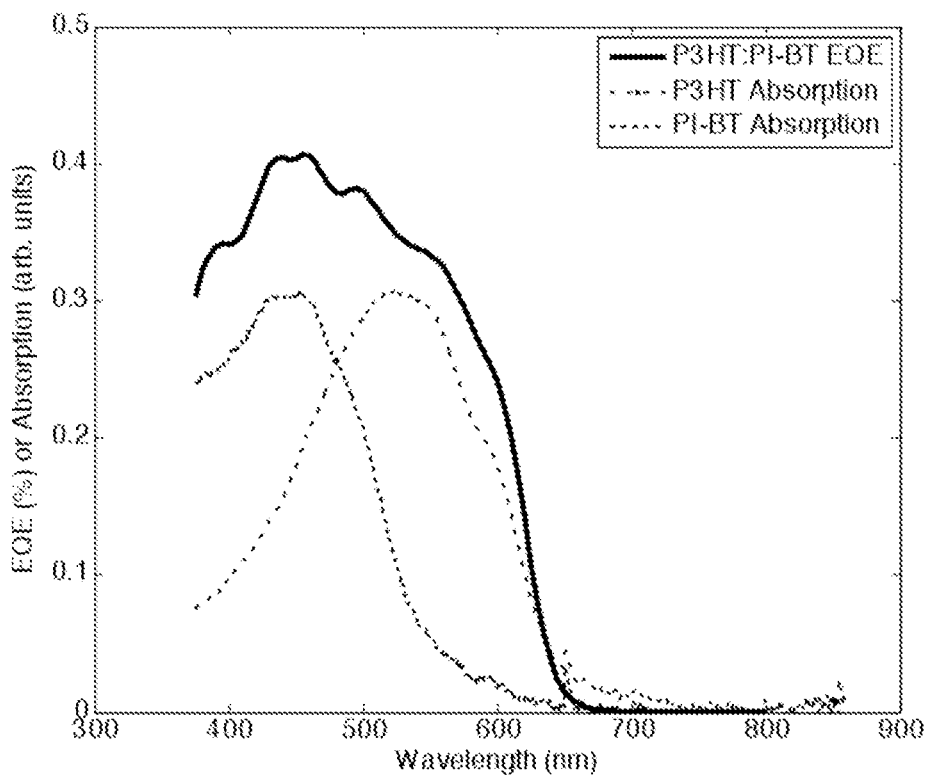

J-V curves under AM1.5G illumination of one sun intensity are shown on FIG. 7a. J-V curves of optimized P3HT:NI-BT BHJ devices prepared from chloroform solutions of 12 mg/mL total concentration of P3HT and NI-BT in a 1:2 (by weight) ratio are also shown on FIG. 7a. Optimized device stacks included ITO/PEDOT:PSS (25 nm)/P3HT:NI-BT (ca. 120 nm)/Ca (7 nm)/Al (200 nm). Optimized PI-BT samples were annealed after cathode deposition at 110° C. for 3 minutes, whereas optimized NI-BT samples were annealed prior to cathode deposition at 110° C. for 10 minutes. External quantum efficiency (EQE) curves of the optimal P3HT:PI-BT devices are shown in FIG. 7b. A collection of relevant solar cell parameters is given in Table 2 for optimized P3HT-based BHJ devices based on EV-BT, PI-BT and NI-BT. The highest power conversion efficiency obtained was 2.55%, which we believe is the highest for a single-junction BHJ solar cell using any organic donor material and a non-fullerene acceptor. An average value of 2.3% was determined for a large data set of more than 40 devices.

TABLE 2

Solar Cell Device Performance Metrics.

| acceptor | $J_{sc}$ (mAcm$^{-2}$) | $V_{oc}$ (V) | FF (%) | EQE (%) | PCE (%) |
|---|---|---|---|---|---|
| EV-BT | 1.9 | 0.77 | 51 | 11[a] | 0.73 |
| PI-BT | 4.7 | 0.96 | 56 | 41 | 2.54 |
| NI-BT | 0.5 | 0.65 | 40 | | 0.12 |

[a]From literature.

A very large $V_{oc}$ of 0.96 V is observed in the J-V curve of the P3HT:PI-BT device. These higher voltages were expected compared to P3HT:PC$_{61}$BM devices (typically 0.65V) given the smaller electron affinity of PI-BT (3.3 eV) as compared to PC$_{61}$BM (3.7 eV). The EQE curves shown in FIG. 7b demonstrate that while only 30 to 40% of the incident photons between 375 and 600 nm result in photocurrent, a significant portion of that photocurrent is due to absorption by the acceptor phase followed by hole transfer to the donor. The (normalized) absorption spectra of P3HT and PI-BT thin films are provided as dashed curves for reference. With significant contributions to photocurrent from the acceptor material, there is increased capability to improve solar spectrum absorption via complementary selection of donor/acceptor blend systems. Solar cells made with NI-BT as the acceptor performed considerably worse in all metrics compared to those made with PI-BT and EV-BT. While the electron affinity and chemical structure of NI-BT are similar to PI-BT and would suggest similar performance, we believe that the tendency of P3HT:NI-BT BHJ cells not to crystallize upon deposition or annealing, as well as the larger intramolecular reorganization energy for electron transport, leads to very poor electron transport through the device. This could allow significant recombination losses across the donor/acceptor interface that would result in lower $J_{SC}$, $V_{OC}$, and fill factor values. Two-dimensional grazing incidence x-ray scattering images (GIXS) performed at the Stanford Synchrotron Radiation Laboratory (SSRL) showed significant crystallization of the PI-BT and EV-BT based films, as well as the lack thereof in the case of the NI-BT based films.

Figure 8A:
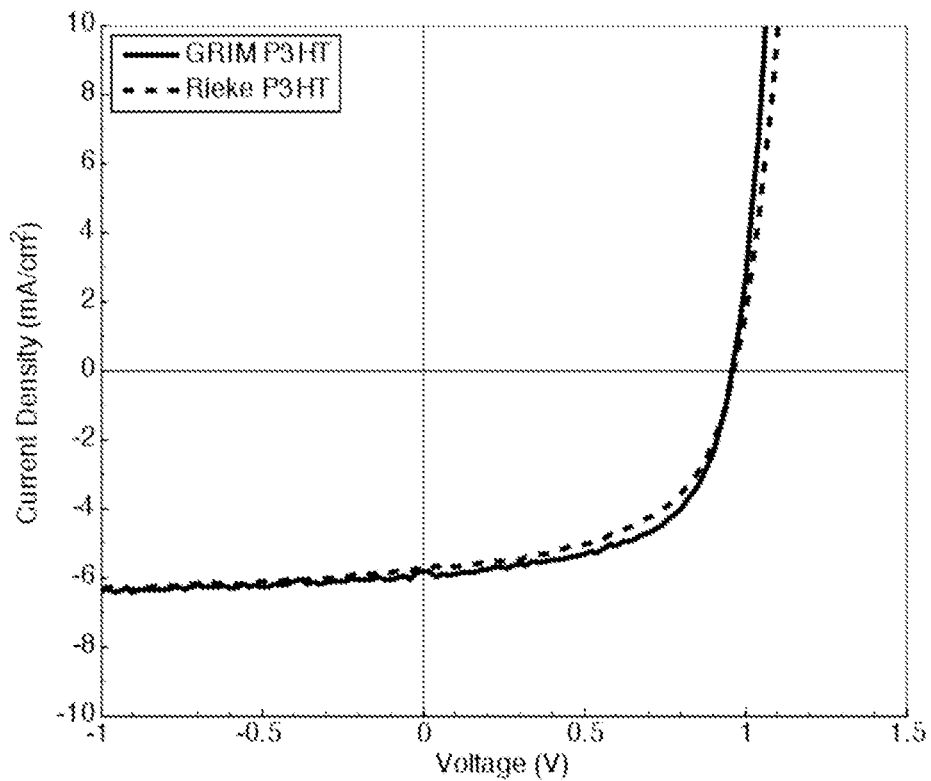
FIGS. 8a-b show further solar cell results relating to PI-BT.
Figure 8B:
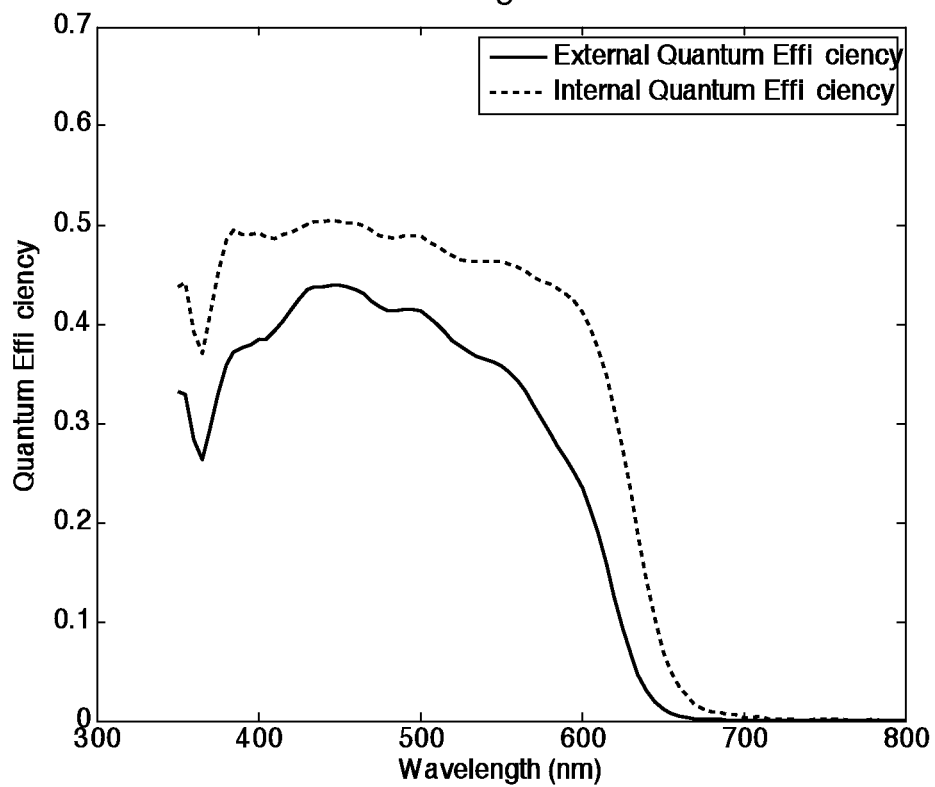

FIGS. 8a-b show further experimental results relating to PI-BT OPV cells. FIG. 8a shows current density (J) vs. voltage (V) curves for bulk heterojunction solar cells using PI-BT as acceptor material and either commercially available P3HT (Rieke Metals, EE-grade) or Grignard Metathesis Method (GRIM) prepared P3HT as the donor material. Power conversion efficiency of the best Rieke P3HT:PI-BT device is 3.03%. Power conversion efficiency of the best GRIM P3HT:PI-BT device is 3.36%. FIG. 8b shows external and internal quantum efficiency spectra of Rieke P3HT:PI-BT bulk heterojunction solar cells. Further results are given in Table 3 below.

TABLE 3

Further experimental results relating to PI-BT OPV cells.

| | Rieke P3HT | GRIM P3HT |
|---|---|---|
| $J_{sc}$ (mA/cm$^2$) | 5.8 | 5.8 |
| $V_{oc}$ (V) | 0.97 | 0.96 |

TABLE 3-continued

Further experimental results relating to PI-BT OPV cells.

| | Rieke P3HT | GRIM P3HT |
|---|---|---|
| Fill Factor | 0.54 | 0.60 |
| Efficiency (%) | 3.03 | 3.36 |

D) Conclusion

In conclusion, a new series of novel acceptor molecules for organic photovoltaics bearing vinylimide and benzothiadiazole units was successfully designed and synthesized. These units created extended electron-deficient A-B-A π-conjugated systems that can be tuned to vary the HOMO and LUMO levels of the acceptor molecules. By varying the moieties used to build an acceptor molecule (i.e. imide or Vinazene-bearing "A" building blocks), the transport and optical gaps of the acceptor can be tuned to fit a specific donor material and optimize electron transfer and efficiency during photocurrent generation. Since the electron affinities of PI-BT and NI-BT (3.30 and 3.35 eV) are smaller than that of $PC_{61}BM$ (3.7 eV), a larger $V_{oc}$ for P3HT/PI-BT devices (up to 0.96 V) is observed. The new acceptors also show strong absorption in the visible spectrum with molar extinction coefficients greater than $10^5$ $M^{-1}$ $cm^{-1}$. The best P3HT:PI-BT-based OPV device yields a record high PCE for a BHJ utilizing a non-fullerene acceptor material of 3.36%.

The invention claimed is:

1. An organic photovoltaic cell including an electron acceptor material, wherein the electron acceptor material comprises molecules including one or more moieties selected from the group consisting of: vinylimide, vinylthioimide, alkynylimide and/or alkynylthioimide moieties;
   wherein the molecules have an electron acceptor group B and one to six electron acceptor A groups covalently bound to a B group, wherein each of the A groups individually consists of:
      a single XYZ structure, wherein X and Y are connected by two single covalent bonds, wherein Y and Z are connected by a single covalent bond, and wherein Y has no bonds other than the two single covalent bonds to X and the single covalent bond to Z;
   a) wherein X consists of a

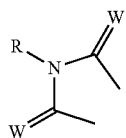

fragment,
   wherein W are each independently O or S, and wherein R is a $C_1$-$C_{20}$ branched, unbranched or cyclic alkyl or heteroalkyl group having none, some or all hydrogen atoms substituted with fluorine atoms;
   b) wherein Y consists of one or more aromatic rings; and
   c) wherein Z is a doubly bonded hydrocarbon having a —C═C— structure or a triply bonded —C≡C— structure.

2. The organic photovoltaic cell of claim 1, wherein the molecules have two distinct instances of the A group bound to an instance of the B group to form an A'-B-A" structure.

3. The organic photovoltaic cell of claim 1, wherein the molecules have two identical instances of the A group bound to an instance of the B group to form an A'-B-A' structure.

4. The organic photovoltaic cell of claim 1, wherein the electron acceptor A groups comprise a vinylimide moiety.

5. The organic photovoltaic cell of claim 1, wherein the electron acceptor B group comprises a benzothiadiazole moiety.

6. The organic photovoltaic cell of claim 5, wherein the electron acceptor A groups comprise a vinylimide moiety.

7. The organic photovoltaic cell of claim 1, wherein the A groups are covalently bonded to the group B via Z in the A groups.

8. The organic photovoltaic cell of claim 1, wherein the molecules provide electron transport.

9. The organic photovoltaic cell of claim 1, wherein the molecules are substantially planar.

10. The organic photovoltaic cell of claim 1, wherein the organic photovoltaic cell is a 2-layer cell including a layer of the electron acceptor material and a layer of an electron donor material sandwiched between two electrodes.

11. The organic photovoltaic cell of claim 1, wherein the organic photovoltaic cell is a bulk heterojunction cell including a mixture of the electron acceptor material and an electron donor material sandwiched between two electrodes.

* * * * *